(12) United States Patent
Mao et al.

(10) Patent No.: US 8,405,748 B2
(45) Date of Patent: Mar. 26, 2013

(54) CMOS IMAGE SENSOR WITH IMPROVED PHOTODIODE AREA ALLOCATION

(75) Inventors: Duli Mao, Sunnyvale, CA (US);
Hsin-Chih Tai, San Jose, CA (US);
Vincent Venezia, Sunnyvale, CA (US);
Yin Qian, Milpitas, CA (US); Howard E. Rhodes, San Martin, CA (US)

(73) Assignee: OmniVision Technologies, Inc., Santa Clara, CA (US)

( * ) Notice: Subject to any disclaimer, the term of this patent is extended or adjusted under 35 U.S.C. 154(b) by 243 days.

(21) Appl. No.: 12/837,870

(22) Filed: Jul. 16, 2010

(65) Prior Publication Data

US 2012/0013777 A1      Jan. 19, 2012

(51) Int. Cl.
*H04N 3/14*      (2006.01)
(52) U.S. Cl. ........................................ 348/278
(58) Field of Classification Search .................. 348/270, 348/272, 277–282, 294, 266, 265
See application file for complete search history.

(56) References Cited

U.S. PATENT DOCUMENTS

| 6,137,100 | A | 10/2000 | Fossum et al. | |
|---|---|---|---|---|
| 6,867,549 | B2 * | 3/2005 | Cok et al. | 315/169.3 |
| 7,768,569 | B2 * | 8/2010 | Kozlowski | 348/340 |
| 7,773,137 | B2 * | 8/2010 | Inoue | 348/277 |
| 7,872,681 | B2 * | 1/2011 | Davidovici | 348/280 |
| 2006/0092485 | A1 * | 5/2006 | Tamaru | 358/518 |
| 2007/0034884 | A1 * | 2/2007 | McKee | 257/89 |

* cited by examiner

*Primary Examiner* — Chieh M Fan
*Assistant Examiner* — Ahmed A Berhan
(74) *Attorney, Agent, or Firm* — Blakely Sokoloff Taylor & Zafman LLP

(57) ABSTRACT

Embodiments of an apparatus comprising a pixel array comprising a plurality of macropixels. Each macropixel includes a pair of first pixels each including a color filter for a first color, the first color being one to which pixels are most sensitive, a second pixel including a color filter for a second color, the second color being one to which the pixels are least sensitive and a third pixel including a color filter for a third color, the third color being one to which pixels have a sensitivity between the least sensitive and the most sensitive, wherein the first pixels each occupy a greater proportion of the light-collection area of the macropixel than either the second pixel or the third pixel. Corresponding process and system embodiments are disclosed and claimed.

19 Claims, 7 Drawing Sheets

US 8,405,748 B2

CMOS IMAGE SENSOR WITH IMPROVED PHOTODIODE AREA ALLOCATION

TECHNICAL FIELD

This disclosure relates generally to image sensors and in particular, but not exclusively, relates to an improved photodiode area allocation for CMOS image sensors.

BACKGROUND

Image sensors have become ubiquitous. They are widely used in digital still cameras, cellular phones and security cameras, as well as medical, automobile, and other applications. The technology used to manufacture image sensors, and in particular complementary metal-oxide-semiconductor ("CMOS") image sensors ("CIS"), has continued to advance at great pace. For example, the demands of higher resolution and lower power consumption have encouraged the further miniaturization and integration of these image sensors. Miniaturization also contributes to cost reduction of image sensors.

One field of application in which size and image quality is particularly important is medical applications (e.g., endoscopes). For medical applications the image sensor chip must typically be small while providing a high quality image. In order to achieve these characteristics, for a given chip size the photosensitive apertures should be as large as possible while peripheral circuitry should be as limited as possible.

The pixel (picture element) fill factor denotes that fraction of the area of a pixel that is sensitive to light. Pixel pitch is the physical distance between the pixels in an imaging device. Pixel fill factor has become smaller as pixel pitch has been reduced because the active circuit elements and metal interconnects consume increasing amounts of area in each pixel. One way to address the loss of fill factor is to use a microscale lens (microlens) directly above each pixel to focus the light directly towards the photosensitive portion of the area within the pixel. Another way to address the loss of fill factor is to use backside-illuminated ("BSI") image sensors which place the active pixel circuit elements and metal interconnects on a frontside of an image sensor die, and a photosensitive element within the substrate facing a backside of an image sensor die. For BSI image sensors, the majority of photon absorption occurs near the backside silicon surface. However, a solution that provides larger individual pixel area on the same silicon area would improve BSI image sensors as well as frontside illuminated image sensors.

BRIEF DESCRIPTION OF THE DRAWINGS

Non-limiting and non-exhaustive embodiments of the present invention are described with reference to the following figures, wherein like reference numerals refer to like parts throughout the various views unless otherwise specified.

DETAILED DESCRIPTION OF THE ILLUSTRATED EMBODIMENTS

Embodiments of an apparatus, process and system for an image sensor with improved photodiode area allocation are described herein. In the following description numerous specific details are set forth to provide a thorough understanding of the embodiments. One skilled in the relevant art will recognize, however, that the techniques described herein can be practiced without one or more of the specific details, or with other methods, components, materials, etc. In other instances, well-known structures, materials, or operations are not shown or described in detail to avoid obscuring certain aspects.

Reference throughout this specification to "one embodiment" or "an embodiment" means that a particular feature, structure, or characteristic described in connection with the embodiment is included in at least one embodiment of the present invention. Thus, the appearances of the phrases "in one embodiment" or "in an embodiment" in various places throughout this specification are not necessarily all referring to the same embodiment. Furthermore, the particular features, structures, or characteristics may be combined in any suitable manner in one or more embodiments.

Figure 1:
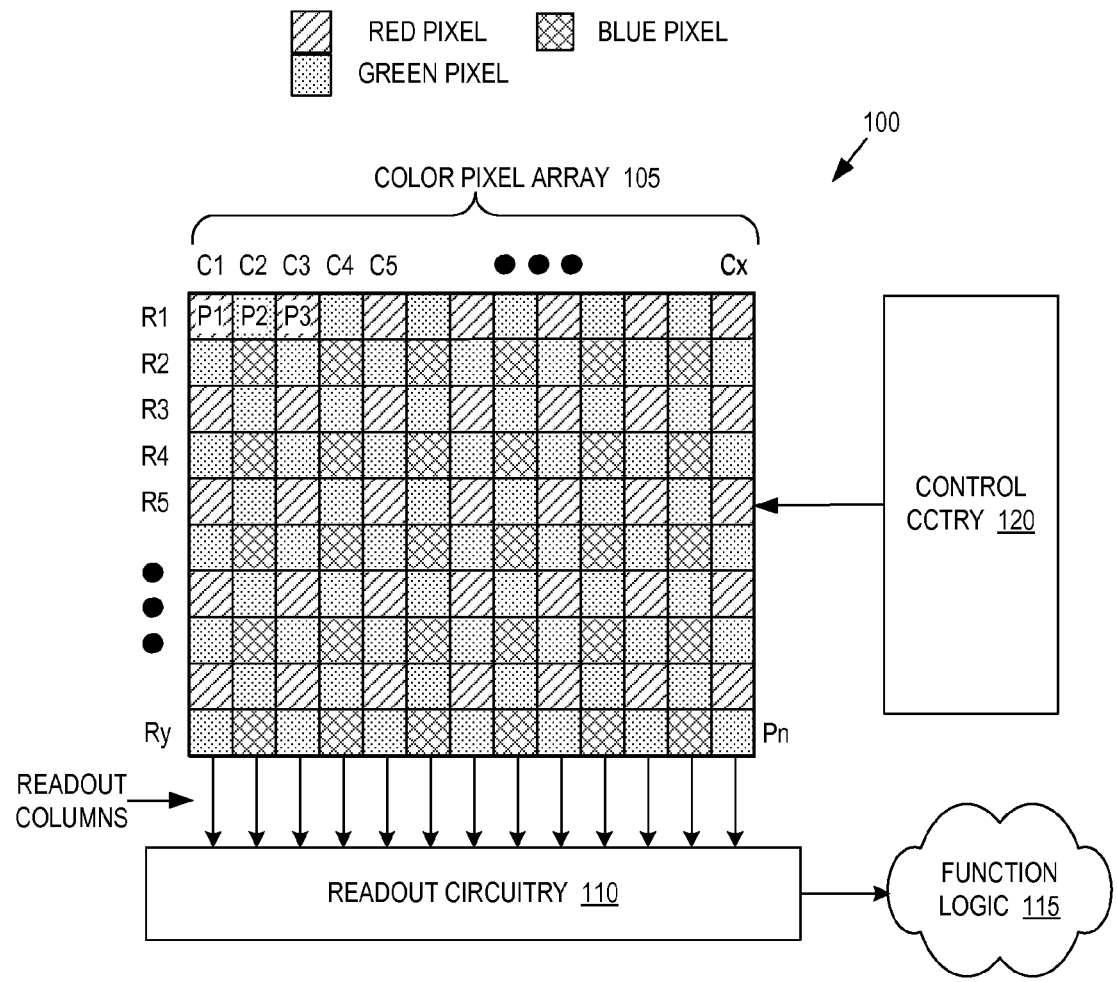
FIG. 1 is a block diagram of a CMOS image sensor.

FIG. 1 illustrates an embodiment of a CMOS image sensor 100 including a color pixel array 105, readout circuitry 110, function logic 115, and control circuitry 120. Color pixel array 105 is a two-dimensional ("2D") array of imaging sensors or pixels (e.g., pixels P1, P2 . . . , Pn) having X number of pixel columns and Y number of pixel rows. In one embodiment, each pixel is a complementary metal-oxide-semiconductor ("CMOS") imaging pixel. Color pixel array 105 may be implemented as either a frontside-illuminated pixel array or a backside-illuminated image pixel array. As illustrated, each pixel is arranged into a row (e.g., rows R1 to Ry) and a column (e.g., column C1 to Cx) to acquire image data of a person, place, or object, which can then be used to render a 2D image of the person, place, or object. After each pixel has acquired its image data or image charge, the image data is read out by readout circuitry 110 and transferred to function logic 115. Readout circuitry 110 may include amplification circuitry, analog-to-digital ("ADC") conversion circuitry, or otherwise. Function logic 115 may simply store the image data or even manipulate the image data by applying post-image effects (e.g., crop, rotate, remove red eye, adjust brightness, adjust contrast, or otherwise). Control circuitry 120 is coupled to pixel array 105 to control operational characteristic of color pixel array 105. For example, control circuitry 120 may generate a shutter signal for controlling image acquisition.

Color pixel array 105 assigns color to each pixel through the use of a color filter array ("CFA"). CFAs assign a separate primary color to each pixel by placing a filter of that color over the pixel. As photons pass through a filter of a certain primary color to reach the pixel, only wavelengths of that primary color will pass through. All other wavelengths will be absorbed. Primary colors are a set of colors identified by science as being the building blocks for all other colors. Examples of primary colors include red, green and blue (commonly referred to as RGB) and cyan, magenta and yellow (commonly referred to as CMY). In the RGB color model, for example, combining varying amounts of red, green and blue will create all the other colors in the spectrum.

Numerous types of CFAs have been developed for different applications. CFA patterns are almost exclusively comprised of identical square pixel elements, referred to as micropixels, arranged in rectangular X, Y patterns. Hexagonal and octagonal pixels have been proposed, but repeating pixel units, referred to as macropixels, are usually found in groups of four. In the vast majority of digital camera image sensors, the most popular CFA is the Bayer pattern. Using a checkerboard pattern with alternating rows of filters, the Bayer pattern has twice as many green pixels as red or blue pixels, and they are arranged in alternating rows of red wedged between greens, and of blue wedged between greens. This pattern takes advantage of the human eye's predilection to see green luminance as the strongest influence in defining sharpness. What's more, the Bayer pattern produces identical images regardless of how you hold the camera—in landscape or portrait mode.

Figure 2:
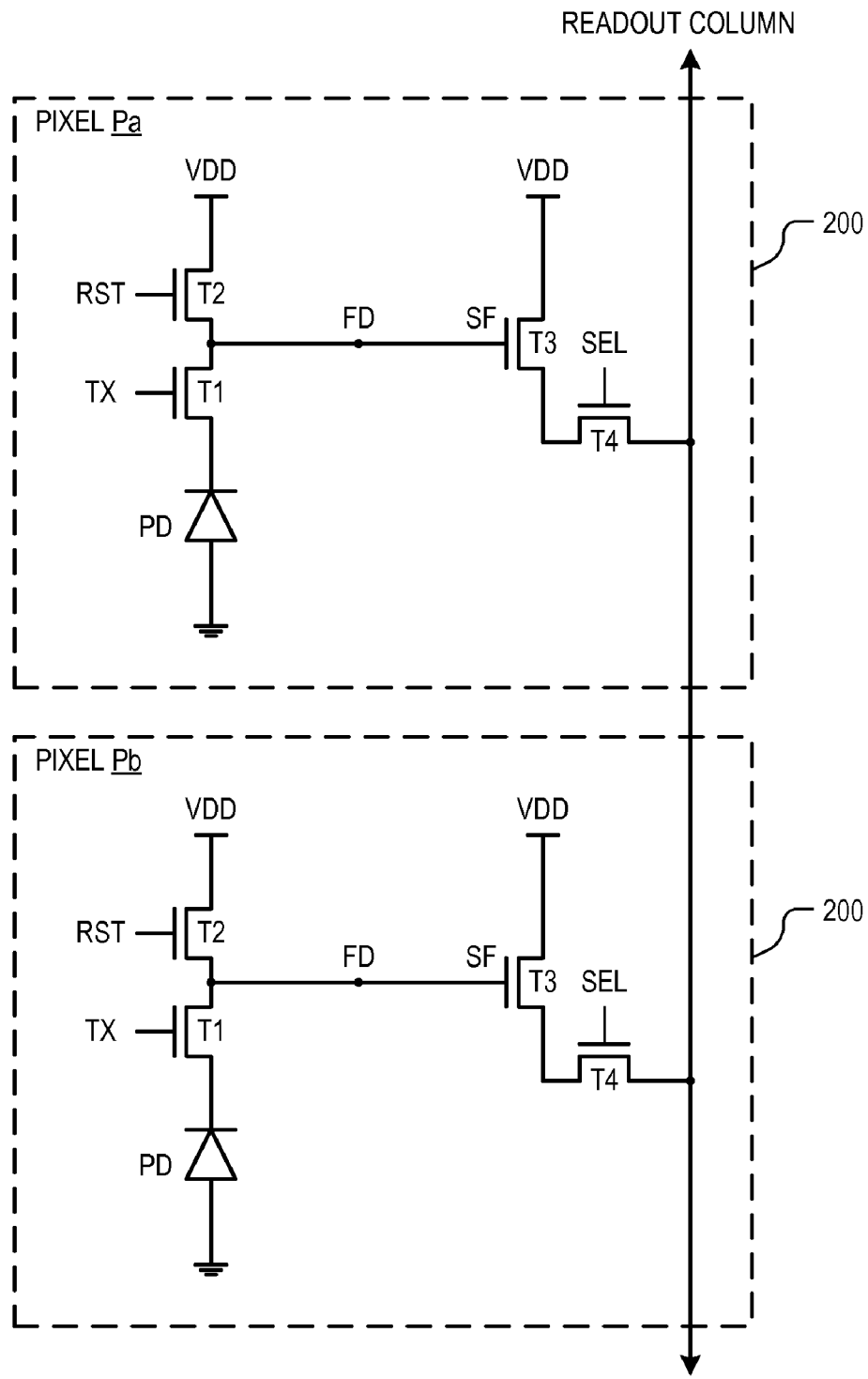
FIG. 2 is a circuit diagram of pixel circuitry of two 4T pixels within a conventional CMOS image sensor.

FIG. 2 is a circuit diagram illustrating an embodiment of the pixel circuitry 200 of two four-transistor ("4T") pixels within a pixel array 105. Pixel circuitry 200 represents one possible architecture for implementing each pixel within color pixel array 105 of FIG. 1, but embodiments of the present invention are not limited to 4T pixel architectures; rather, one of ordinary skill in the art having the benefit of the instant disclosure will understand that the present teachings are also applicable to 3T designs, 5T designs, and various other pixel architectures. In FIG. 2, pixels Pa and Pb are arranged in two rows and one column. The illustrated embodiment of each pixel circuitry 200 includes a photosensitive element PD, a transfer transistor T1, a reset transistor T2, a source-follower ("SF") transistor T3 and a select transistor T4. During operation of each pixel, transfer transistor T1 receives a transfer signal TX, which transfers the charge accumulated in photosensitive element PD to a floating diffusion node FD. Reset transistor T2 is coupled between a power rail VDD and the floating diffusion node FD to reset the FD (e.g., discharge or charge the FD to a preset voltage) under control of a reset signal RST. The floating diffusion node FD is coupled to control the gate of SF transistor T3. SF transistor T3 is coupled between the power rail VDD and select transistor T4. SF transistor T3 operates as a source-follower providing a high impedance output from the pixel. Finally, select transistor T4 selectively couples the output of pixel circuitry 200 to the readout column line under control of a select signal SEL. In one embodiment of a pixel array 105, the TX signal, the RST signal, and the SEL signal are generated by control circuitry 120.

Figure 3:
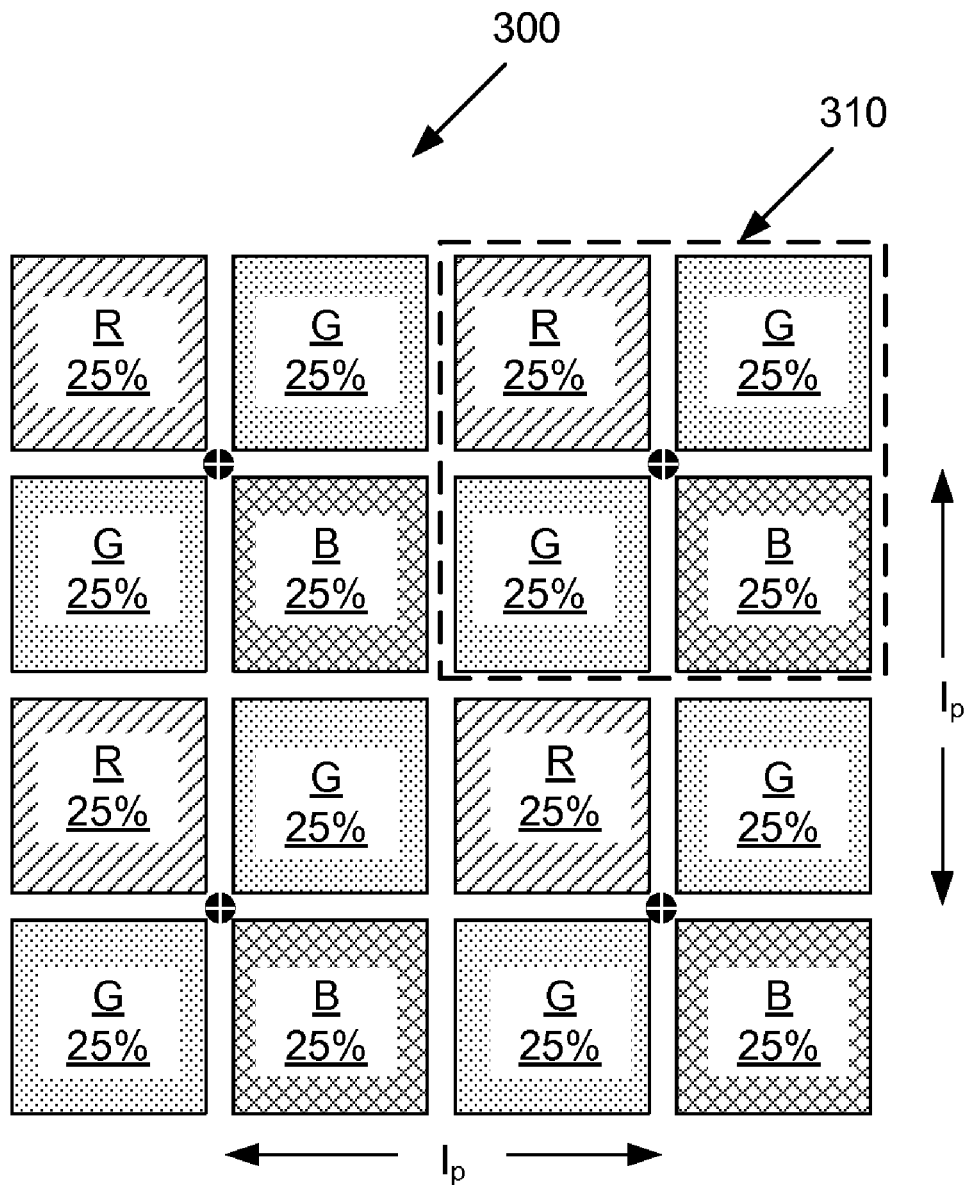
FIG. 3 is a schematic representation of a Bayer-patterned pixel array showing a grouping of pixels into a macropixel block.

FIG. 3 shows a portion 300 of pixel array 105 and a Bayer-patterned macropixel 310 including four pixels (hereafter referred to as "micropixels" to distinguish them from the macropixel). The Bayer-patterned macropixels are positioned with the pixel array with a uniform X and Y separation distance $I_p$. In the illustrated embodiment, each micropixel within macropixel 310 occupies substantially the same light collection area—that is, each micropixel occupies substantially 25% of the light-collection area of the macropixel. A Bayer-patterned macropixel is a repeating unit of a color filter array (CFA) for arranging red (R), green (G) and blue (B) color filters over an array of photosensitive elements. When a Bayer-patterned pixel array's charge is read out, the colors are recorded sequentially line by line. One line would be BGB-GBG, followed by a line of GRGRGR, and so forth. This is known as sequential RGB.

An important aspect of any imaging system is the signal-to-noise ratio (SNR). Signal-to-noise ratio may become smaller as pixels are miniaturized since the noise level may remain the same while the signal becomes smaller as the collection area becomes smaller. Gain can be used to boost the output signal, but any such gain element would increase the noise along with the signal because the amplification circuit itself also produces noise (e.g., Johnson noise produced by the components). In the prior art, attempts have been made to improve color image quality by improving the SNR of colored pixels, and especially those colors which conventionally produce less signal. Pixels in RGB-type color image sensors typically have varying responses to different colors. For pixels with substantially equal light-collection areas, the ratio between signals from the red pixels (Vr), green pixels (Vg), and blue pixels (Vb) is typically in the rough ratio of 2.5 Vb:1.5 Vr:1.0 Vg, meaning that the blue pixels produce 2.5 times less signal than the green pixels and the red pixels produce 1.5 times less signal than the green pixels. Thus, for a given pixel area blue pixels produce the smallest signal, green pixels produce the largest signal, and red pixels produce signals somewhere between the green pixels and the blue pixels.

One conventional solution to improve the SNR of image sensors seeks to equalize the output signal of all pixels in a macropixel by changing the area of each micropixel to collect more or less photons to compensate for the difference in signals produced by the different colors. Since it is important to maintain or increase the image sensor resolution, the micropixel pitch must be kept the same or decreased. In that case the macropixel area allocation to the different colors in its makeup may be changed from an equal allocation. U.S. Pat. No. 6,137,100, for example, allocates the largest light-collection area to the blue color since it produces the lowest signal level. The smallest light-collection area is allocated to the green color which produces the highest signal level.

Figures 4A, 4B:
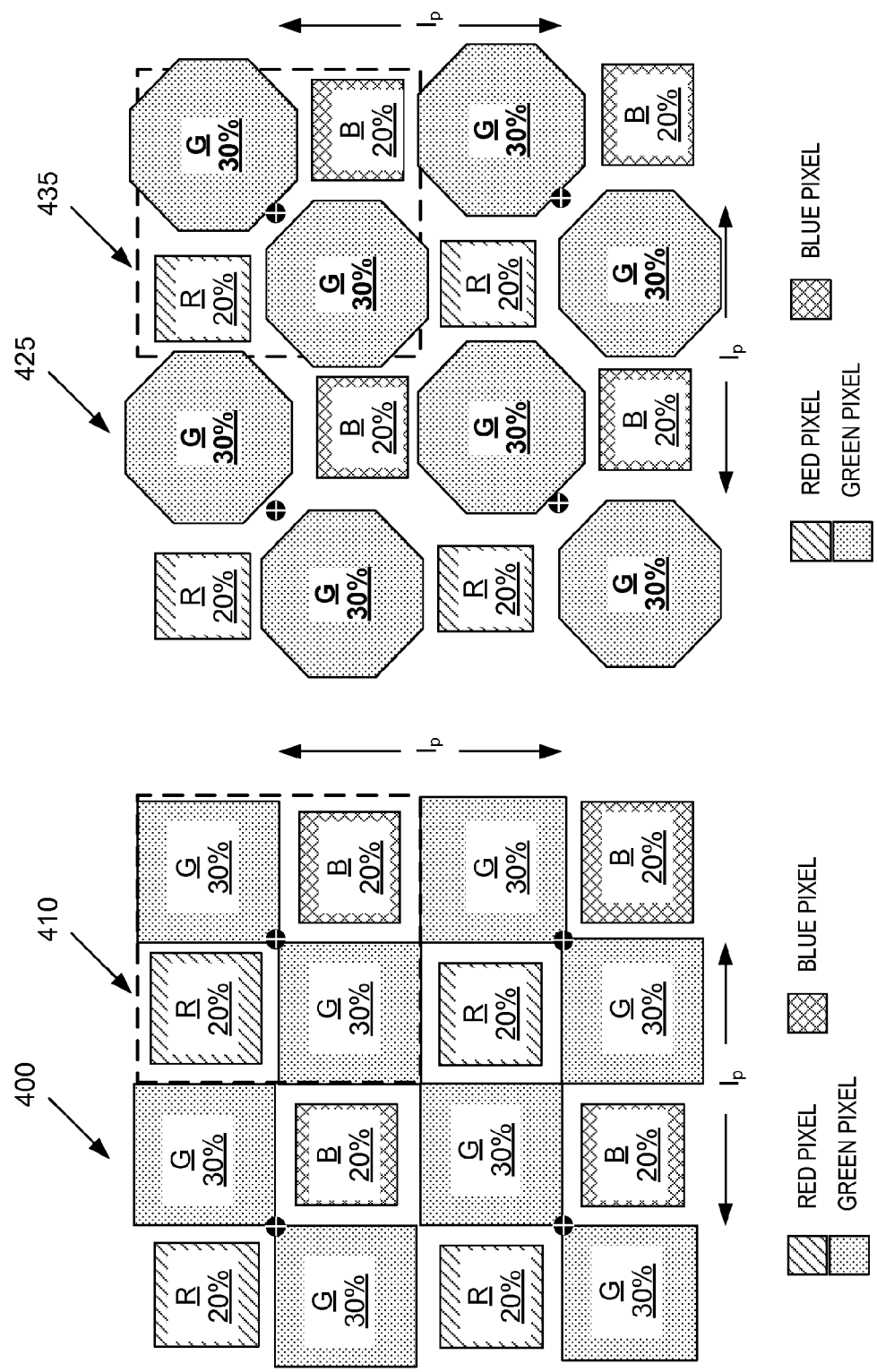
FIG. 4A is schematic representation of an embodiment of a pixel array including a Bayer-patterned macropixel block.
FIG. 4B is a schematic representation of a pixel array including an alternative embodiment of a Bayer-patterned macropixel block.

FIG. 4A shows a portion 400 of a pixel array including an embodiment of a Bayer-patterned macropixel 410 having four micropixels. The Bayer-patterned macropixels are positioned within a pixel array with the same uniform X and Y separation distance $I_p$ as shown in FIG. 3. In contrast to macropixel 310, in which each micropixel is allocated substantially 25% of the macropixel's light-collection area, macropixel 410 allocates different portions of the macropixel's light-collection area to the different colors. The illustrated embodiment allocates about 30% of the macropixel's light-collection area to each of the two green micropixels and about 20% each to the blue and red micropixels. Other embodiments can allocate the macropixel's light-collection area differently. For example, in other embodiments the green pixels can each occupy between about 20% and about 40% of the light-collection area of the macropixel, the blue pixel can occupy between about 10% and about 30% of the light-collection area, and the red pixel can occupy between about 10% and about 30% of the light-collection area. In some embodiments both green micropixels can have substantially the same light-collection area allocation and the blue and red micropixels can have substantially equal but smaller allocations than the green micropixels, but in other embodiments this need not be the case.

An object of embodiments of a pixel array that include a macropixel such as macropixel 410 is to improve SNR by increasing the collection area allocated to the green color at the expense of the collection area allocated to the blue and red color. This arrangement takes advantage of the human eye's predilection to see green luminance as the strongest influence in defining sharpness. What's more, it produces identical images regardless of how you hold the camera—in landscape or portrait mode. This solution is particularly advantageous for applications requiring high resolution and high SNR with minimum pixel size where color accuracy is a lower priority. Such applications may be found in automotive, security, or machine vision systems.

FIG. 4B illustrates a portion 425 of a pixel array including an alternative embodiment of a macropixel 435. Macropixel 435 is in many respects similar to macropixel 410. The principal difference between macropixels 410 and 435 is in the shape of the green micropixels. In an embodiment where the green micropixels are assigned a proportion of the macropixel's light-collection area so large as to cause their corners to overlap, their shape can be made octagonal as illustrated to maintain a measure of isolation between the green pixels.

Figure 4C:
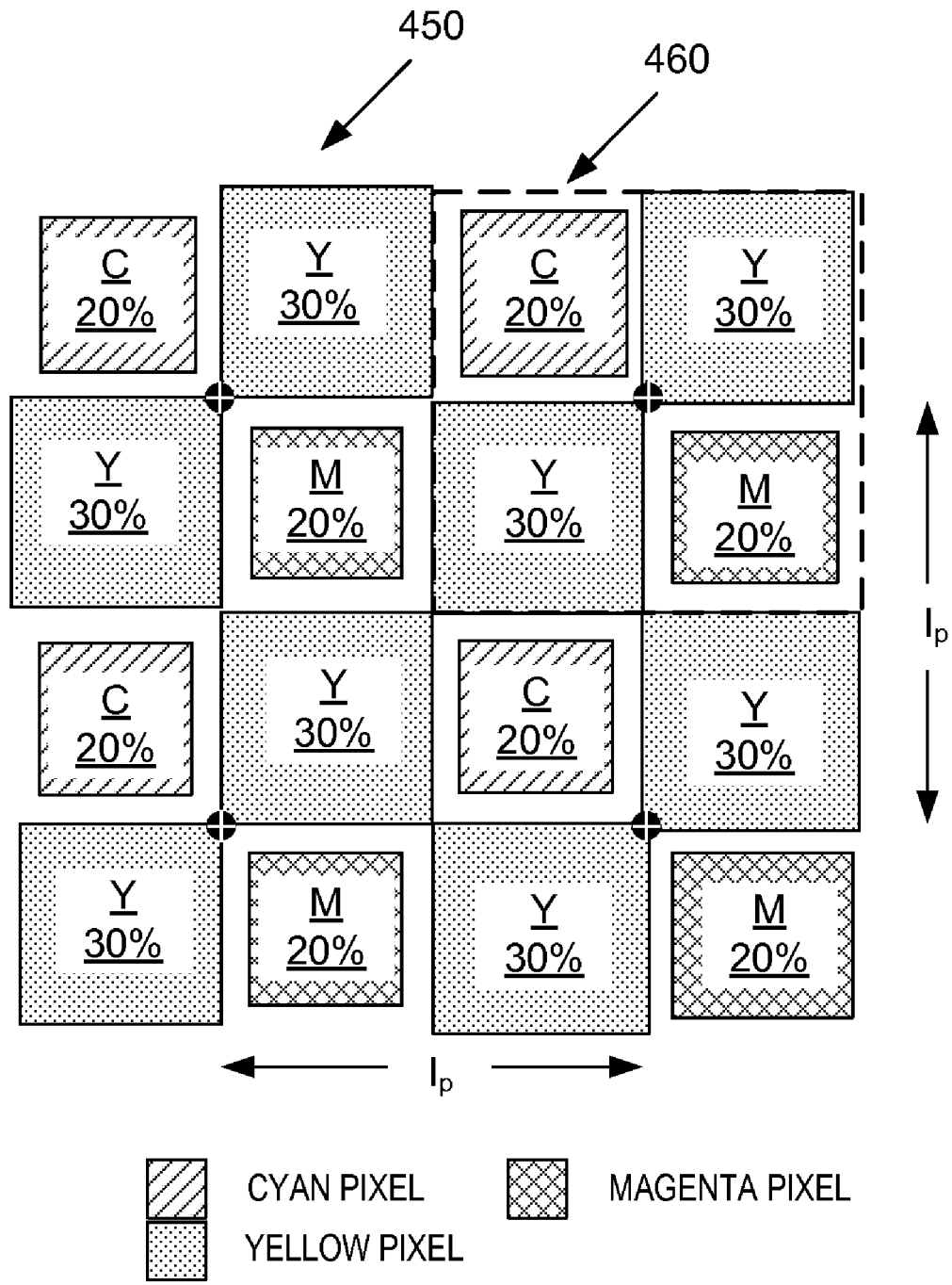
FIG. 4C is a schematic representation of a pixel array including another alternative embodiment of a macropixel block.

FIG. 4C illustrates a portion 450 of a pixel array with another alternative embodiment of a macropixel 460. Macropixel 460 is in many respects similar to macropixels 410 and 435. The principal difference between macropixel 460 and macropixels 410 and 425 is in the primary colors that are used: macropixels 410 and 435 use red, green and blue as primary colors, while macropixel 460 instead uses magenta, yellow and cyan. Magenta, yellow and cyan are a common alternative set of primary colors that can be used to produce color images. As with the RGB color set, for the same pixel area magenta, yellow and cyan produce different signal levels: yellow produces the largest signal, magenta the smallest signal, and cyan produces a signal in between yellow and magenta. Analogously to macropixel 410, then, macropixel 460 allocates about 30% of the macropixel's light-collection to each of the two yellow micropixels and about 20% each to the magenta and cyan micropixels.

As with macropixels 410 and 435, other embodiments of macropixel 460 can allocate the macropixel's light-collection area differently. For example, in other embodiments the yellow pixels can each occupy between about 20% and about 40% of the light-collection area of the macropixel, the magenta pixel can occupy between about 10% and about 30% of the light-collection area, and the cyan pixel can occupy between about 10% and about 30% of the light-collection area. In some embodiments both yellow micropixels can have the substantially the same light-collection area allocation and the magenta and cyan micropixels can have substantially equal but smaller allocations than the yellow micropixels, but in other embodiments this need not be the case. As in macropixel 435, in an embodiment where the yellow micropixels in macropixel 460 are assigned a proportion of the macropixel's light-collection area so large as to cause their corners to overlap, their shape can be made octagonal to maintain a measure of isolation between the yellow pixels.

Figure 5A:
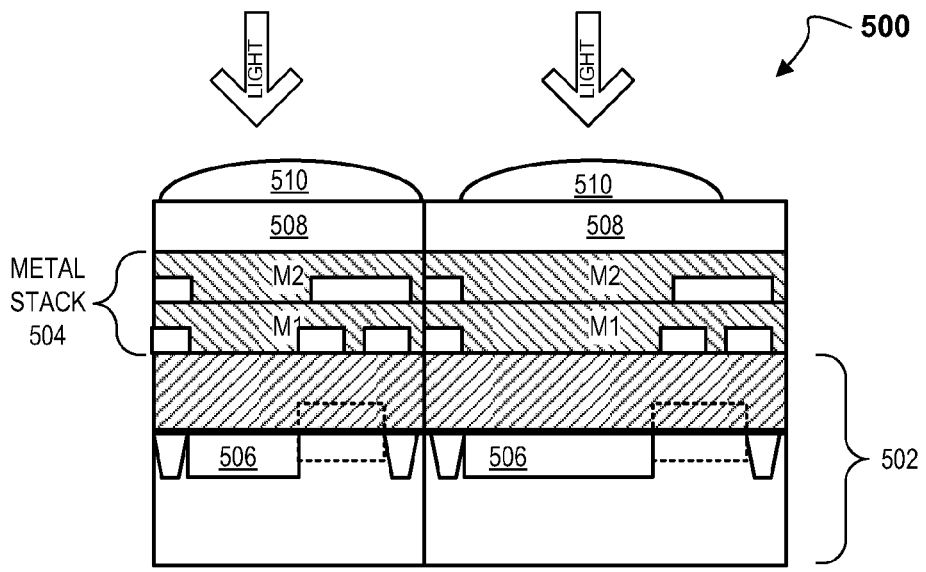
FIG. 5A is cross-sectional view of a pair of frontside-illuminated pixels.
Figure 5B:
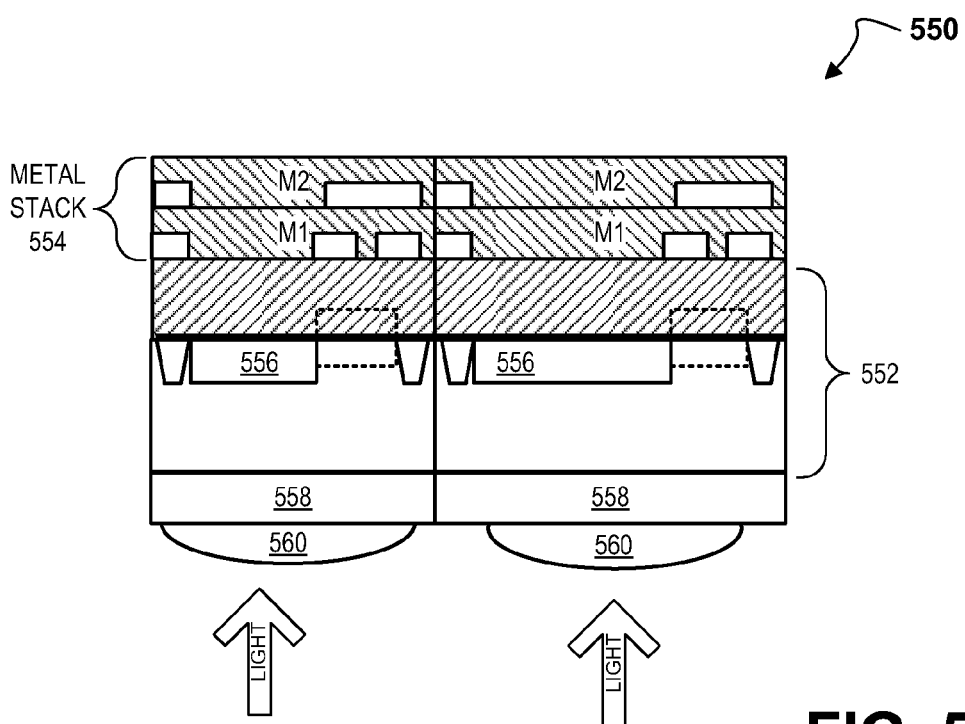
FIG. 5B is a cross-sectional view of a pair of backside-illuminated pixels.

FIGS. 5A-5B illustrate cross-sections of frontside-illuminated and backside-illuminated embodiments of a pair of micropixels in a CMOS image sensor. The macropixel embodiments previously described can be implemented as a frontside-illuminated embodiment as shown in FIG. 5A or a backside-illuminated embodiment as shown in FIG. 5B. FIG. 5A illustrates an embodiment of pixels 500 in a frontside-illuminated CMOS image sensor. The front side of pixels 500 is the side of substrate 502 upon which the pixel circuitry is disposed and over which metal stack 504 for redistributing signals is formed. Metal layers M1 and M2 are patterned in such a manner as to create an optical passage through which light incident on the frontside-illuminated pixels 500 can reach the photosensitive or photodiode ("PD") region 506. To implement a color image sensor, the front side includes color filters 508, each disposed under a microlens 510 that aids in focusing the light onto PD region 506. To implement the embodiments of macropixels 410, 435 or 460, each color filter 508 has the appropriate color and each of pixels 500 is sized to have the light-collection area allocation that corresponds to its color.

FIG. 5B illustrates an embodiment of pixels 550 in a backside-illuminated CMOS image sensor. As with the pixels 500, the front side of pixels 550 is the side of substrate 552 upon which the pixel circuitry is disposed and over which metal stack 554 for redistributing signals is formed. The backside is the side of substrate 552 opposite the front side. To implement a color image sensor, the backside includes color filters 558, each disposed between the backside and microlenses 560. Microlenses 560 aid in focusing the light onto PD region 556. By illuminating the backside of pixels 550, the metal interconnect lines in metal stack 554 would not obscure the path between the object being imaged and the collecting areas, resulting in greater signal generation by PD regions 556. To implement the embodiments of macropixels 410, 435 or 460, each color filter 558 has the appropriate color and each of pixels 550 is sized to have the light-collection area allocation that corresponds to its color.

Figure 6:
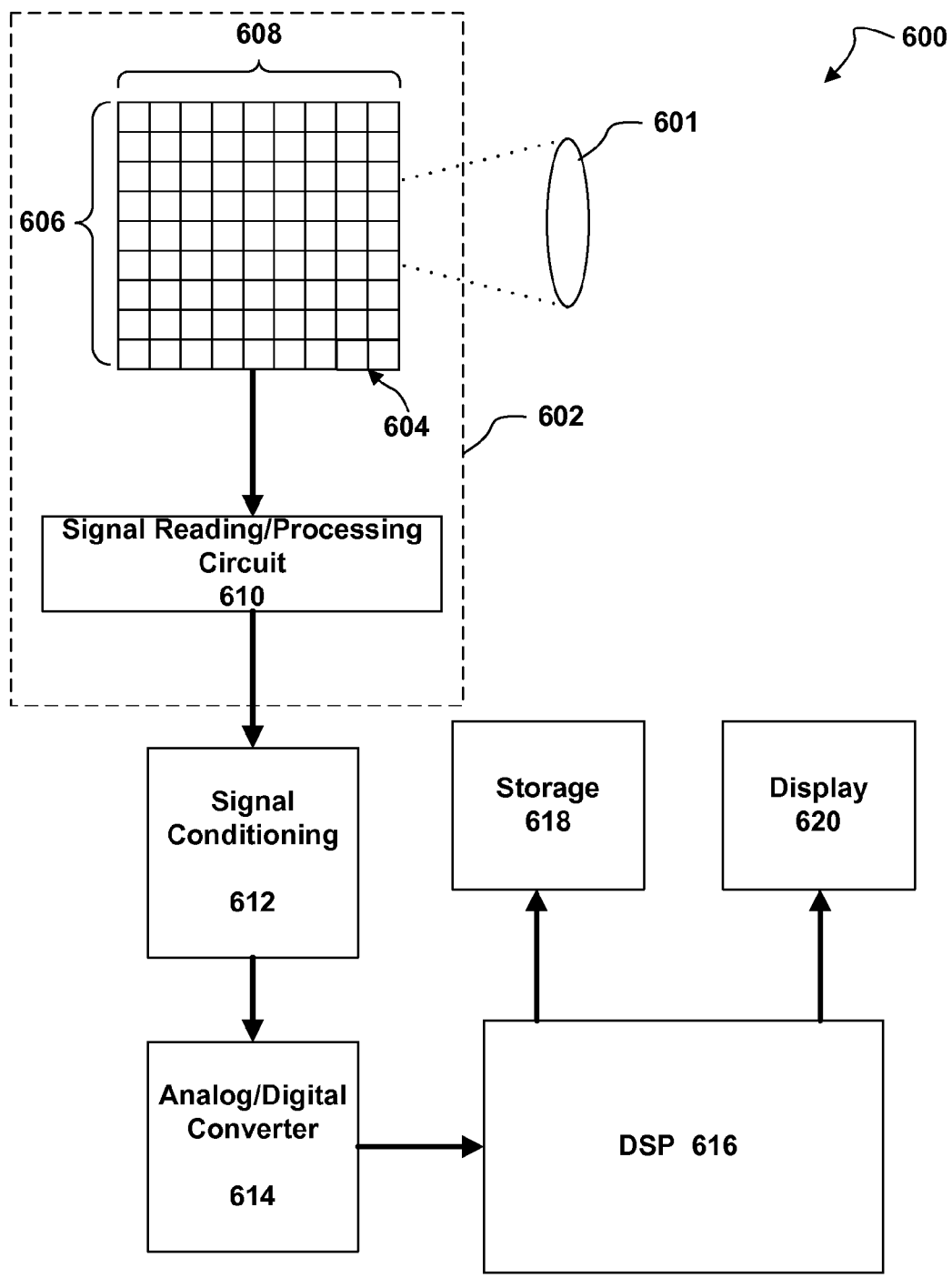
FIG. 6 is a block diagram of an embodiment of an imaging system including a pixel array having macropixel blocks according to the present invention.

FIG. 6 illustrates an embodiment of an imaging system 600. Optics 601, which can include refractive, diffractive or reflective optics or combinations of these, are coupled to image sensor 602 to focus an image onto the pixels in pixel array 604 of the image sensor. Pixel array 604 captures the image and the remainder of imaging system 600 processes the pixel data from the image.

Image sensor 602 comprises a pixel array 604 and a signal reading and processing circuit 610. The pixels in pixel array 604 can be frontside-illuminated or backside-illuminated pixels as shown in FIGS. 5A-5B and can be grouped into the macropixel embodiments shown in FIGS. 4A-4C. During operation of pixel array 604 to capture an image, each pixel in pixel array 604 captures incident light (i.e., photons) during a certain exposure period and converts the collected photons into an electrical charge. The electrical charge generated by each pixel can be read out as an analog signal, and a characteristic of the analog signal such as its charge, voltage or current will be representative of the intensity of light that was incident on the pixel during the exposure period.

In one embodiment pixel array 604 is two-dimensional and includes a plurality of pixels arranged in rows 606 and columns 608. Illustrated pixel array 604 is regularly shaped, but in other embodiments the array can have a regular or irregular arrangement different than shown and can include more or less pixels, rows, and columns than shown. Moreover, in different embodiments pixel array 604 can be a color image sensor including red, green, and blue pixels or can be a magenta-cyan-yellow image sensor.

Image sensor 602 includes signal reading and processing circuit 610. Among other things, circuit 610 can include circuitry and logic that methodically reads analog signals from each pixel, filters these signals, corrects for defective pixels, and so forth. In an embodiment where circuit 610 performs only some reading and processing functions, the remainder of the functions can be performed by one or more other components such as signal conditioner 612 or DSP 616. Although shown in the drawing as an element separate from pixel array 604, in some embodiments reading and processing circuit 610 can be integrated with pixel array 604 on the same substrate or can comprise circuitry and logic embedded within the pixel array. In other embodiments, however, reading and processing circuit 610 can be an element external to pixel array 604 as shown in the drawing. In still other embodiments, reading and processing circuit 610 can be an element not only external to pixel array 604, but also external to image sensor 602.

Signal conditioner 612 is coupled to image sensor 602 to receive and condition analog signals from pixel array 604 and reading and processing circuit 610. In different embodiments, signal conditioner 612 can include various components for conditioning analog signals. Examples of components that can be found in the signal conditioner include filters, amplifiers, offset circuits, automatic gain control, etc. In an embodiment where signal conditioner 612 includes only some of these elements and performs only some conditioning functions, the remaining functions can be performed by one or more other components such as circuit 610 or DSP 616. Analog-to-digital converter (ADC) 614 is coupled to signal conditioner 612 to receive conditioned analog signals corresponding to each pixel in pixel array 604 from signal conditioner 612 and convert these analog signals into digital values.

Digital signal processor (DSP) 616 is coupled to analog-to-digital converter 614 to receive digitized pixel data from ADC 614 and process the digital data to produce a final digital image. DSP 616 can include a processor and an internal memory in which it can store and retrieve data. After the image is processed by DSP 616, it can be output to one or both of a storage unit 618 such as a flash memory or an optical or magnetic storage unit and a display unit 620 such as an LCD screen.

The above description of illustrated embodiments of the invention, including what is described in the abstract, is not intended to be exhaustive or to limit the invention to the precise forms disclosed. While specific embodiments of, and examples for, the invention are described herein for illustrative purposes, various modifications are possible within the scope of the invention, as those skilled in the relevant art will recognize.

These modifications can be made to the invention in light of the above detailed description. The terms used in the following claims should not be construed to limit the invention to the specific embodiments disclosed in the specification. Rather, the scope of the invention is to be determined entirely by the following claims, which are to be construed in accordance with established doctrines of claim interpretation.

The invention claimed is:

1. An apparatus comprising: a pixel array comprising a plurality of quadrilateral macropixels formed on a substrate, each macropixel including four pixels, wherein the four pixels include: a pair of first pixels in opposite corners, wherein each of the first pixels includes a color filter for a first color, the first color being one to which pixels are most sensitive, and a second pixel and a third pixel in opposite corners, wherein: the second pixel includes a color filter for a second color, the second color being one to which the pixels are least sensitive, and the third pixel including a color filter for a third color, the third color being one to which pixels have a sensitivity between the least sensitive and the most sensitive, wherein the first pixels each occupy a greater proportion of the light-collection area of the macropixel than either the second pixel or the third pixel, such that the first pixels each occupy substantially between 20 percent and 40 percent of the light-collection area of the macropixel, the second pixel occupies substantially between 10 percent and 20 percent of the light-collection area of the macro pixel, and the third pixel occupies substantially between 10 percent and 20 percent of the light collection area of the macro pixel.

2. The apparatus of claim 1 wherein the first pixels each occupy substantially 30 percent of the light-collection area of the macropixel, the second pixel occupies substantially 20 percent of the light-collection area of the macropixel, and the third pixel occupies substantially 20 percent of the light-collection area of the macropixel.

3. The apparatus of claim 1 wherein the first color is green, the second color is blue and the third color is red.

4. The apparatus of claim 1 wherein the first color is yellow, the second color is magenta and the third color is cyan.

5. The apparatus of claim 1 wherein the pair of first pixels have a shape that is octagonal.

6. The apparatus of claim 1 wherein the first, second and third pixels are formed on the front side of the substrate and the filters for the first, second and third color are formed on the front side of the substrate.

7. The apparatus of claim 1 wherein the first, second and third pixels are formed on the front side of the substrate and the first, second and third color filters are formed on the backside of the substrate.

8. The apparatus of claim 1, further comprising control circuitry or readout circuitry coupled to the pixels of the pixel array.

9. The apparatus of claim 8 wherein the control circuitry can generate one or more of a transfer (TX) signal, a reset (RST) signal and a select signal for each pixel within the pixel array.

10. A system comprising: an image sensor formed in a substrate, wherein the image sensor has a pixel array including a plurality of quadrilateral macropixels, each macropixel comprising four pixels, wherein the four pixels include: a pair of first pixels in opposite corners, wherein each of the first pixels includes a color filter for a first color, the first color being one to which pixels are most sensitive, and a second pixel and a third pixel in opposite corners, wherein: the second pixel includes a color filter for a second color, the second color being one to which the pixels are least sensitive, and the third pixel includes a filter for a third color, the third color being one to which pixels have a sensitivity between the least sensitive and the most sensitive, wherein the first pixels each occupy a greater proportion of the light-collection area of the macropixel than the second pixel or the third pixel, such that the first pixels each occupy substantially between 20 percent and 40 percent of the light-collection area of the macropixel, the second pixel occupies substantially between 10 percent and 30 percent of the light-collection area of the macropixel, and the third pixel occupies substantially between 10 percent and 30 percent of the light-collection area of the macropixel: and control circuitry and processing circuitry coupled to the image sensor to read out and process a signal from the pixel array.

11. The system of claim 10 wherein the first pixels each occupy substantially 30 percent of the light-collection area of the macropixel, the second pixel occupies substantially 20 percent of the light-collection area of the macropixel, and the third pixel occupies substantially 20 percent of the light-collection area of the macropixel.

12. The system of claim 10 wherein the first color is green, the second color is blue and the third color is red.

13. The system of claim 10 wherein the first color is yellow, the second color is magenta and the third color is cyan.

14. The system of claim 10 wherein the pair of first pixels have a shape that is octagonal.

15. The system of claim 10 wherein the first, second and third pixels are formed on the front side of the pixel array and the filters for the first, second and third color are formed on the front side of the pixel array.

16. The system of claim 10 wherein the first, second and third pixels are formed on the front side of the pixel array and the first, second and third color filters are formed on the backside of the pixel array.

17. The system of claim 10, further comprising an analog-to-digital converter (ADC) coupled to the processing circuitry.

18. The system of claim 17 wherein the processing circuitry includes a digital signal processor coupled to the ADC.

19. The system of claim 10 wherein each pixel further comprises:
- a photodetector formed in the substrate;
- a floating diffusion formed in the substrate; and
- a transfer gate formed on the substrate between a photodetector and the floating diffusion.

* * * * *